(12) United States Patent
Cuvalci et al.

(10) Patent No.: US 9,916,994 B2
(45) Date of Patent: Mar. 13, 2018

(54) SUBSTRATE SUPPORT WITH MULTI-PIECE SEALING SURFACE

(71) Applicant: APPLIED MATERIALS, INC., Santa Clara, CA (US)

(72) Inventors: Olkan Cuvalci, Sunnyvale, CA (US); Gwo-Chuan Tzu, Sunnyvale, CA (US); Xiaoxiong Yuan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 482 days.

(21) Appl. No.: 13/787,402

(22) Filed: Mar. 6, 2013

(65) Prior Publication Data

US 2014/0251207 A1  Sep. 11, 2014

(51) Int. Cl.
*H01L 21/00* (2006.01)
*H01L 21/67* (2006.01)
*H01L 21/687* (2006.01)

(52) U.S. Cl.
CPC .. *H01L 21/67126* (2013.01); *H01L 21/68785* (2013.01)

(58) Field of Classification Search
CPC ......... H01L 21/67126; H01L 21/68785; H01L 21/6875
USPC ....................................................... 118/728
See application file for complete search history.

(56) References Cited

U.S. PATENT DOCUMENTS

| 4,213,698 A | 7/1980 | Firtion et al. |
| 5,846,332 A * | 12/1998 | Zhao et al. ............... 118/728 |
| 6,364,957 B1 * | 4/2002 | Schneider ........... C23C 16/4585 118/500 |
| 6,383,931 B1 * | 5/2002 | Flanner ............. H01L 21/31138 257/E21.256 |
| 6,494,955 B1 | 12/2002 | Lei et al. |
| 6,513,796 B2 | 2/2003 | Leidy et al. |
| 7,316,721 B1 * | 1/2008 | Redden ................... B01D 46/24 406/172 |
| 2003/0066484 A1 * | 4/2003 | Morikage ......... H01J 37/32009 118/723 E |
| 2010/0083902 A1 * | 4/2010 | Kim et al. ................ 118/723 R |
| 2011/0049100 A1 * | 3/2011 | Han et al. ........................ 216/67 |
| 2012/0181738 A1 * | 7/2012 | Hirose ................ C23C 16/4404 269/303 |
| 2014/0217665 A1 | 8/2014 | Cuvalci et al. |

FOREIGN PATENT DOCUMENTS

| JP | 2003115476 A | * | 4/2003 |
| JP | 2011003730 A | * | 1/2011 |
| KR | 20060110555 A | * | 10/2006 | ........... H01L 21/324 |

* cited by examiner

*Primary Examiner* — Gordon R Baldwin
*Assistant Examiner* — Charlee Bennett
(74) *Attorney, Agent, or Firm* — Moser Taboada; Alan Taboada

(57) ABSTRACT

Embodiments of substrate supports and sealing rings for use in a substrate support are provided herein. In some embodiments, a substrate support structure includes an arcuate sealing piece having a first side including a generally planar support surface; a first arcuate portion; a second arcuate portion disposed radially inward of the first arcuate portion; a first end portion comprising a first arcuate extension extending from the first arcuate portion; and a second end portion comprising a second arcuate extension extending from the second arcuate portion.

17 Claims, 5 Drawing Sheets

SECTION A-A

SECTION B-B

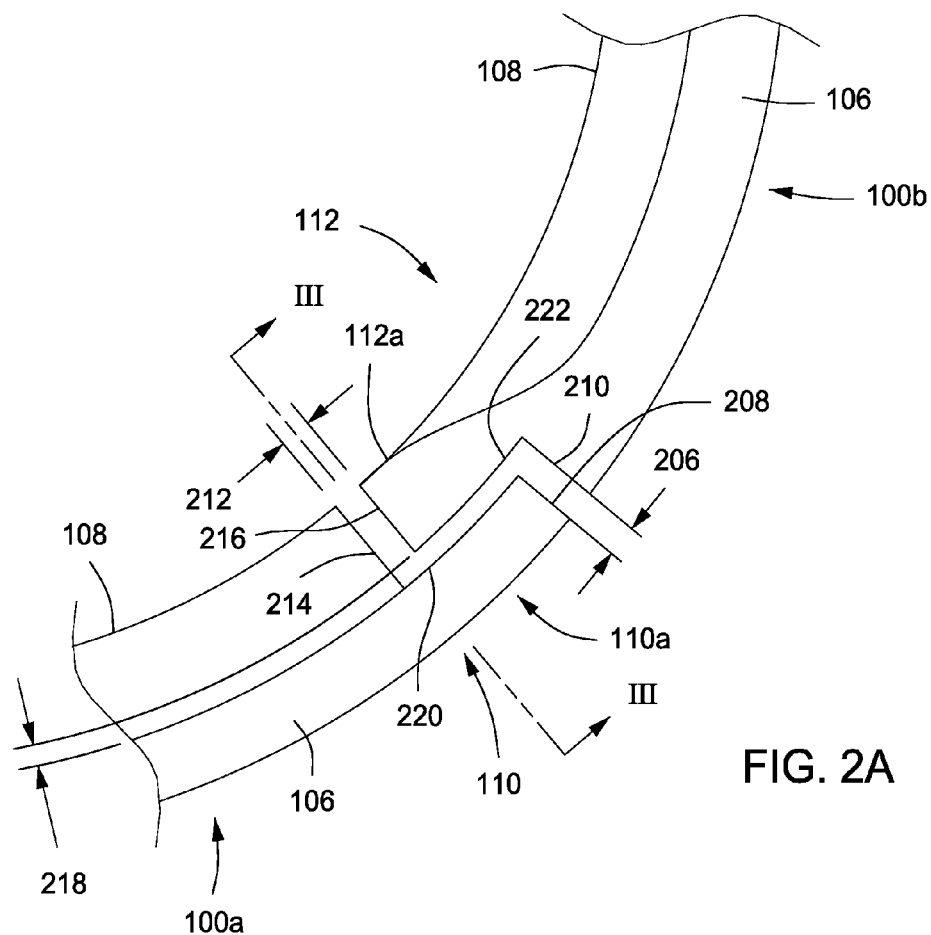
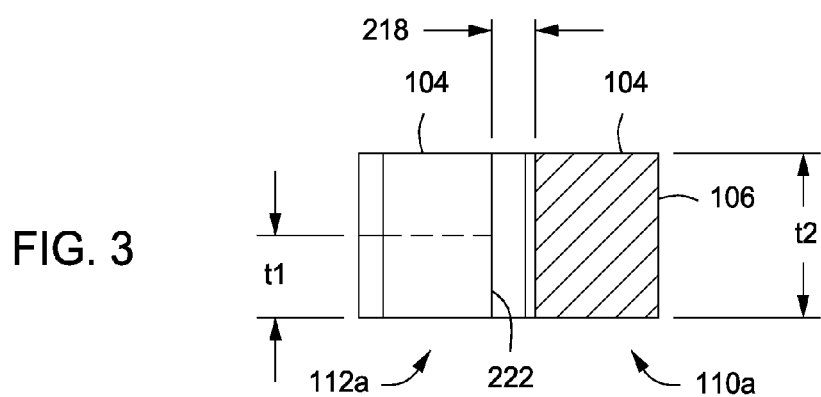

SUBSTRATE SUPPORT WITH MULTI-PIECE SEALING SURFACE

FIELD

Embodiments of the present invention generally relate to semiconductor processing equipment.

BACKGROUND

Atomic layer deposition (ALD) and chemical vapor deposition (CVD) are two exemplary methods used in semiconductor fabrication to deposit thin films on a substrate in a processing chamber. Typical processing chambers may include a substrate support, for example a heater plate, which often includes a sealing ring positioned around perimeter. The substrate often rests upon a portion of the sealing ring as well as support elements inside of the sealing ring. The sealing ring may also provide a seal with the backside of the substrate to allow the formation of a backside pressure. The seal may also minimize contamination of the backside of the substrate by process gases. However, the inventors have observed several problems with convention sealing rings.

For example, contact between the substrate and metallic components during processing often leads to metal contamination of the substrate and a high instance of product failure. To alleviate the contamination, substrate support rings formed from metallic materials may be coated with a non-metallic material to eliminate, or at least reduce, metallic contact with the substrate. Alternatively, support rings may be formed from non-metallic materials to prevent direct metal contamination.

In addition, semiconductor fabrication often takes place at elevated temperatures, which can cause thermal expansion of the substrate support and the sealing ring. Differing thermal expansion characteristics of components of the substrate support can cause processing difficulties. For example, when using a metallic sealing ring having a non-metallic coating, the ring material and the coating typically have different thermal expansion characteristics, causing flaking and failure of the coating. Also, non-metallic sealing rings often have thermal expansion characteristics that differ from the substrate support plate to which they are mounted, leading to warping or cracking of the ring during processing.

Lastly, the inventors have observed that during processing, a portion of the substrate resting upon the sealing ring may be adversely affected by the higher thermal conductivity of the sealing ring as compared to regions of the substrate not supported by the sealing ring.

Therefore, the inventors have provided embodiments of improved substrate supports.

SUMMARY

Embodiments of substrate supports and sealing rings for use in a substrate support are provided herein. In some embodiments, a substrate support structure includes an arcuate sealing piece having a first side including a generally planar support surface; a first arcuate portion; a second arcuate portion disposed radially inward of the first arcuate portion; a first end portion comprising a first arcuate extension extending from the first arcuate portion; and a second end portion comprising a second arcuate extension extending from the second arcuate portion.

In some embodiments, a substrate support may include a ring comprising a plurality of substrate support structures as disclosed herein arranged end-to-end to form the ring. The plurality of substrate support structures include arcuate sealing pieces having respective first arcuate portions that are circumferentially aligned and first and second arcuate extensions of adjacent arcuate sealing pieces that are disposed in an adjacent and overlapping relationship.

Other embodiments and variations are discussed in more detail below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 2A is an enlarged view of the portion II of FIG. 2.

FIG. 3 is a partial cross section taken at line III-III of FIG. 2A

Figure 1:
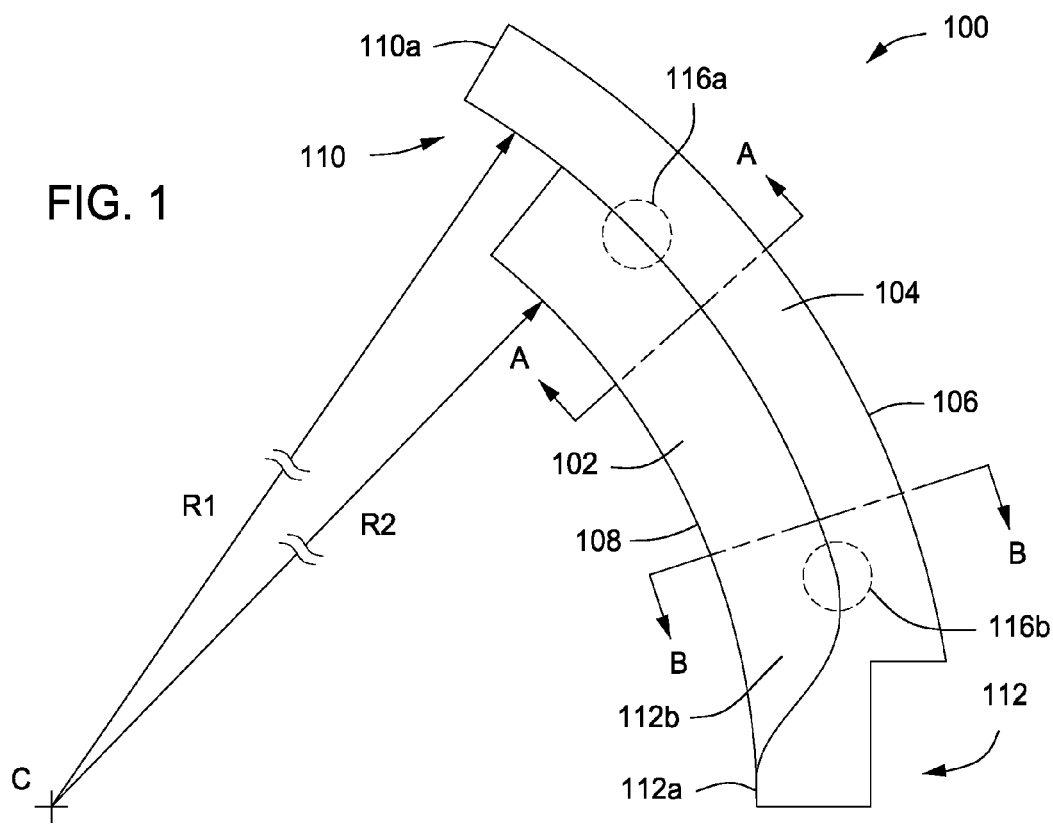
FIG. 1 depicts a plan view of a support structure in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Substrate support during semiconductor fabrication may be provided by substrate support structures in accordance with embodiments disclosed herein. Embodiments may provide one or more of improved sealing capabilities, reduced metal contamination, and reduced thermal conduction to the substrate.

FIG. 1 depicts a substrate support structure, specifically a arcuate sealing piece 100 in accordance with some embodiments of the present invention. The arcuate sealing piece 100 is arcuate in form and comprises a first side 102 (shown in a plan view) comprising a generally planar support surface 104, a first arcuate portion 106, and a second arcuate portion 108. The support surface 104 generally extends along the entire length of the arcuate sealing piece 100. The arcuate sealing piece comprises first end portion 110 with a first arcuate extension 110a and a second end portion 112 with a second arcuate extension 112a.

Figure 1A:
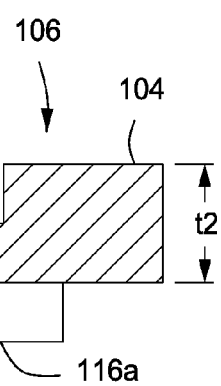
FIGS. 1A and 1B depict cross sectional side views of the support structure of FIG. 1 along lines A-A and B-B, respectively.
Figure 1B:
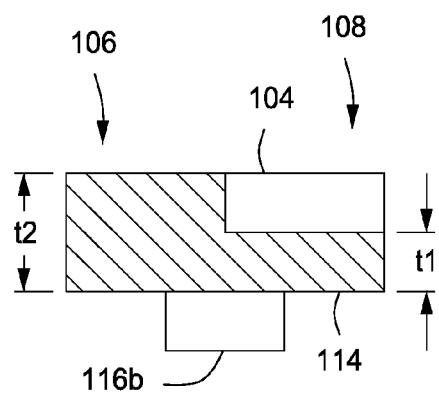

In some embodiments, the entire arcuate sealing piece may have a uniform thickness. Alternatively, in some embodiments, and as illustrated in FIGS. 1A and 1B, a region of the second arcuate portion 108 may have a thickness t1 that is less than the thickness t2 of the first arcuate portion 106. The edge region of a substrate is supported on support surface 104 which is formed by the areas of the arcuate sealing piece 100 having thickness t2 during use. Portions of arcuate sealing piece 100 having a thickness of t1 are not in contact with a substrate during processing. Providing a reduced contact area between the arcuate sealing piece 100 and a substrate may beneficially reduce heat transfer between the arcuate sealing piece 100 and the substrate while maintaining an adequate seal between the substrate and the arcuate sealing piece 100. By reducing the thermal conduction at the support surface 104, more uniform temperature control of the substrate is facilitated, which advantageously may lead to improved processing results.

First arcuate portion 106 and a second arcuate portion 108 may be separate pieces, joined together or remaining separate, or may be formed as a monolithic or unitary piece. In some embodiments, first and second arcuate portions 106, 108 have the same center of curvature, C, with first arcuate portion 106 having a radius of curvature R1 and second arcuate portion 108 having a radius of curvature R2, with R1 larger than R2. In other embodiments, the radii of curvature for first and second arcuate portions 106, 108 may not have the same center.

As illustrated in FIG. 1, first and second arcuate portions 106, 108 are not coterminous at the first end portion 110 or at the second end portion 112. At the first end portion 110, arcuate extension 110a of the first arcuate portion 106 advances beyond the end of second arcuate portion 108. At second end portion 112, arcuate extension 112a of the second arcuate portion 108 advances beyond the end of first arcuate portion 106.

In embodiments where thickness t1 is less than thickness t2, support surface 104 transitions from first arcuate portion 106 to first arcuate portion 106 and second arcuate portion 108 at 112b proximate the second end portion 112, with the support surface extending with the arcuate extension 112a. In embodiments with a transition, the transition may be abrupt, for example a stepped transition, or gradual, for example as the curved transition shown in FIG. 1. The transition may also be a combination of more than one stepped transition, a combination of more than one curved transition, or may be a combination of stepped and curved transitions.

As illustrated in FIGS. 1 and 1B, second end portion 112 of second arcuate portion 108 may have a thickness of t2 the same as, or substantially the same as, the thickness of first arcuate portion 106. The thickness t2 of arcuate extension 112a may provide improved sealing characteristics of edge-joined arcuate sealing pieces 100 as will be described below.

As illustrated in FIGS. 1, 1A, and 1B, arcuate sealing piece 100 may have a second side 114 which may have a locating feature comprising protrusions 116a and 116b, collectively protrusions 116. The protrusions 116 may be cylindrical in cross section according to some embodiments. Other non-limiting cross sections for the protrusions 116 include, for example oval or rectangular, or the protrusions may have shapes similar to an L or an inverted T. Protrusions 116a and 116b may have the same cross section or may have different cross sections.

Protrusions 116a, 116b may be located at any convenient location on second side 114. Arcuate sealing piece 100 is illustrated in FIG. 1 with two protrusions (in phantom lines), although more than two protrusions may be used, for example three or four protrusions. One or more of the protrusions may extend from the first arcuate portion 106, or one or more protrusions may extend from the second arcuate portion 108. Alternately, as illustrated in FIGS. 1, 1A, and 1B, one or more of the protrusions 116 may be on the second side 114, extending from both the first and second arcuate portions 106, 108.

Arcuate sealing piece 100 may be formed from one or more process compatible metallic materials with a non-metallic coating, the metallic materials including non-limiting examples such as aluminum, stainless steel, nickel, or nickel-based alloys, such as Hastelloy®. Arcuate sealing piece 100 may also be formed from one or more process compatible non-metallic materials, including non-limiting examples such as aluminum nitride (AlN), aluminum oxide ($Al_2O_3$), or the like. Fabricating the arcuate sealing pieces from non-metallic materials can advantageously further advantageously reduce the rate of heat transfer between the arcuate sealing piece and the substrate during processing.

Embodiments may include a substrate sealing apparatus comprising a ring formed from a plurality arcuate sealing pieces in which the first and second ends of the arcuate sealing pieces may be positioned end-to-end such that a first arcuate portion of a first piece is circumferentially aligned with the first arcuate portion of an adjacent second arcuate sealing piece. The combined individual sealing surfaces of the plurality of arcuate sealing pieces so arranged forms, or substantially forms, a ring-shaped sealing surface. For example, a plurality of arcuate sealing pieces 100 may be assembled end-to-end as shown in partial schematic in FIG. 2 to form a sealing ring or ring 201. Arcuate sealing pieces 100a and 100b are positioned such that the outer curved edges of 100a and 100b, i.e., curved edges 202 and 204, respectively, have the same, or substantially the same, center of curvature. In the embodiment illustrated in FIG. 2, five arcuate sealing pieces 100a-100e are assembled, although fewer than five or more than five arcuate sealing pieces 100 could be used.

The inventors have noted that a sealing ring comprising a plurality of individual arcuate sealing pieces provides beneficial results with respect to sealing rings formed as a single piece. The multiple piece sealing ring allows for thermal expansion without warping or cracking the ring. As discussed below, the inventive arcuate sealing pieces are configured to allow for expansion without compromising the integrity of the sealing surface or adversely affecting, or with reduced effect of, the sealing characteristics of the ring. In addition, having a multiple piece ring facilitates ease of handling and reduces the cost of the individual components as compared to a monolithic ring. For example, if one arcuate sealing piece were to break or the lost, only a less expensive single piece would need to be replaced, rather than an entire ring.

Figure 2:
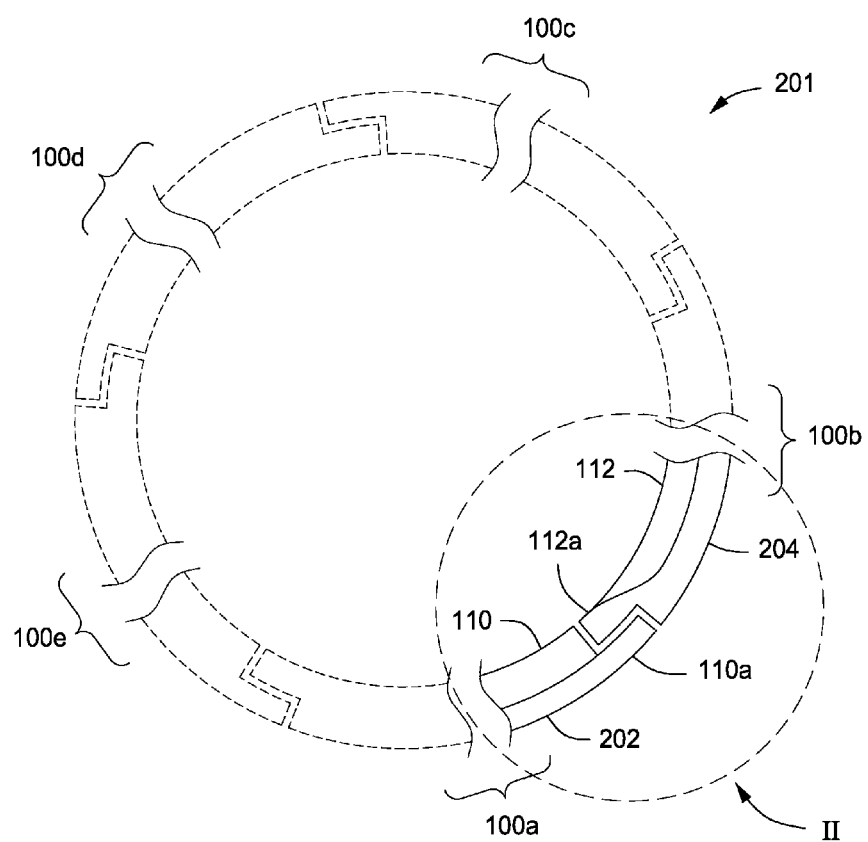
FIG. 2 depicts a plan view representative of a plurality of arcuate sealing pieces arranged in accordance with some embodiments of the present invention.

Each arcuate sealing piece 100a-100e in FIG. 2 is positioned such that the first end portion 110 and second end portion 112 of adjacent arcuate sealing pieces are in close proximity and overlap. In particular, as illustrated in FIGS. 2 and 2A, the adjacent arcuate sealing pieces 100a and 100b are positioned such that the first arcuate portion 106 of the first arcuate sealing piece 100a is circumferentially aligned with the first arcuate portion 106 of the second arcuate sealing piece 100b and the first arcuate extension 110a of the first arcuate sealing piece 100a and the second arcuate extension 112a of the second arcuate sealing piece 100b are in an adjacent and overlapping relationship.

Details of the adjacent and overlapping relationship are shown in an enlarged view in FIG. 2A. In FIG. 2A, only the first end portion 110 of arcuate sealing piece 100a and the second end portion 112 of arcuate sealing piece 100b are shown. The illustration of FIG. 2A is typical of each end-to-end arrangement of arcuate sealing pieces 100a-100e. Therefore, the details discussed with regard to FIG. 2A pertain to all other similarly situated arcuate sealing pieces.

The positioning of the first arcuate sealing piece 100a and the second arcuate sealing piece 100b in FIG. 2A is as described above. A gap in the circumference of the ring 201, that is, the radial gap 206, is provided between the end 208 of the first arcuate extension 110a of first arcuate sealing piece 100a and the end 210 of first arcuate portion 106 of the second arcuate sealing piece 100b. Similarly, a radial gap 212 is provided between the end 214 of second arcuate portion 108 of the first arcuate sealing piece 100a and the end 216 of second arcuate extension 112a of the second arcuate sealing piece 100b. As used herein, a radial gap is a gap that is generally aligned with a radius of the arcuate sealing pieces when arranged about a center point.

The radial gaps 206, 212 provide clearance for the thermally induced movement of arcuate sealing pieces, for example, 100a and 100b as illustrated in FIG. 2A. Radial gaps 206 and 212 may be sized to provide adequate clearance to allow lengthening of the arcuate sealing pieces 100a, 100b as due to elevated temperature, without buckling or cracking. Radial gaps 206, 212 may be dimensionally the same, or substantially the same, or may differ from each other.

The plurality of arcuate sealing pieces 100a-100e beneficially experience less individual thermal expansion than the overall expansion of a complete ring. Accordingly, the arcuate sealing pieces 100a-100e may be less susceptible to warping and cracking than a complete ring. Likewise, a ring formed from a plurality of individual arcuate sealing pieces may be less susceptible to warping and cracking than a one-piece ring. For similar reasons, a coating that may be applied to the individual arcuate sealing pieces will be less susceptible to failure due to the overall reduced thermal expansion differences between the coating and the arcuate sealing pieces.

Radial gaps 206, 212 between adjacent arcuate sealing pieces may vary in size due to thermal expansion and contraction of the adjacent arcuate sealing pieces. However, an arcuate gap 218, that is a gap between adjacent arcuate surfaces of the arcuate sealing pieces forming the ring 201, formed between the arcuate surface 220 and the arcuate surface 222 as illustrated in FIG. 2A advantageously maintains a more uniform size during expansion and contraction of the arcuate sealing pieces. As illustrated in FIG. 3, the arcuate surface 220 of first arcuate extension 110a has a thickness of t2. Similarly, the arcuate surface 222 of the second arcuate extension 112a of arcuate sealing piece 100b also has thickness t2. Thus, and fluid flow between adjacent arcuate sealing pieces only occurs through the arcuate gap 218.

Often in semiconductor processing, a pressure difference is created between the volume bounded by the support ring, the backside of the substrate, and the top of the support plate, and the process chamber volume outside of the described volume. For example, in a vacuum chuck, the vacuum pressure must be maintained to secure the substrate and leakage must also be controlled to prevent contamination of the backside of the substrate from the environment outside of the vacuum region. In other substrate supports, for example electrostatic chucks, a backside gas may be provided to facilitate heat transfer between the substrate support and the substrate. Leakage of the heat transfer medium into the chamber could adversely affect process results. Thus, in order to maintain the desired pressure difference, and to minimize cross contamination, leakage of gas from one volume to the other must be controlled.

Controlled arcuate gaps between end portions of adjacent arcuate sealing pieces advantageously facilitate maintenance of the desired pressure difference. Thus, the arcuate gap 218 may be sized to advantageously control passage of a fluid through the arcuate gap. This controlled fluid flow is sometimes referred to as leakage control. Controlling the leakage through the arcuate gap 218 may be desirable in maintaining a pressure difference between sides of the arcuate sealing pieces 100 (e.g., between a region disposed beneath the substrate and a region disposed radially outward of the substrate during processing). By providing arcuate surface 220 and 222 with thickness t2 as discussed above, the inventors have noted improved leakage control through the arcuate gap 218.

Figure 4:
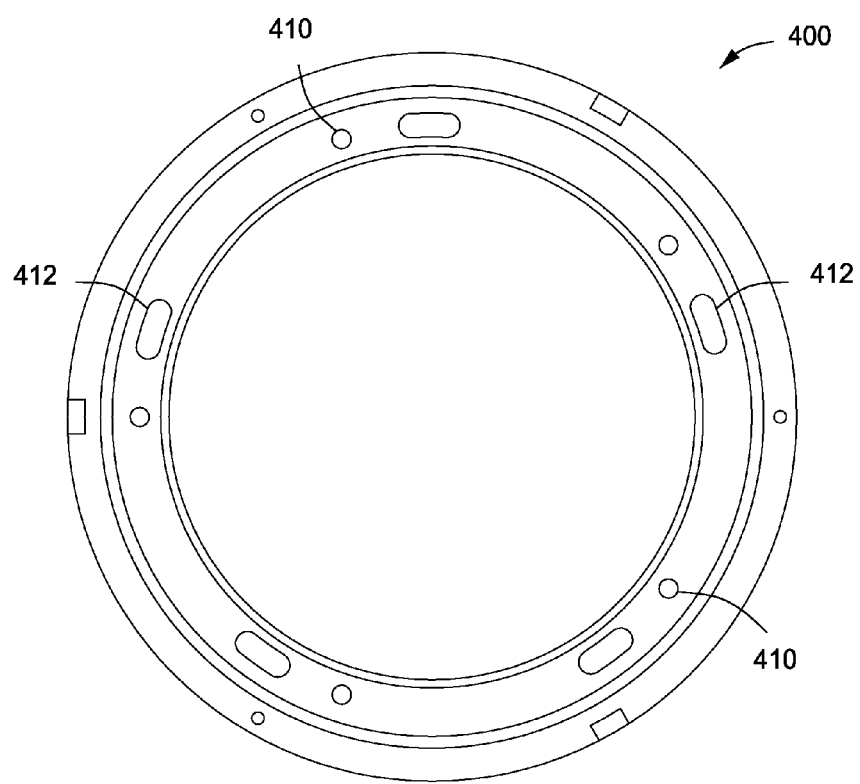
FIG. 4 depicts a plan view of a support plate of a substrate support in accordance with some embodiments of the present invention.

Locating the arcuate sealing pieces 100a-100e as Illustrated in FIG. 2 to obtain the positioning of representative end portions of the first and second arcuate extensions 110a and 112a of FIG. 2A is provided by the cooperation of protrusions 116 with second locating features (e.g., mating locating features) on a support plate. In a non-limiting embodiment illustrated in FIG. 4, a support plate 400 includes second locating features comprising a cylindrical hole 410 and an elongated slot 412. The non-limiting example illustrates second locating features each comprising a hole 410 and a slot 412, to locate five arcuate sealing pieces 100. Other configurations are contemplated, for example, two cylindrical holes 410 or two elongated slots 412. Other configurations may include second locating features to locate more than five arcuate sealing pieces, or fewer than five arcuate sealing pieces.

The exemplary hole 410 is located proximate to the perimeter of the support plate 400 in a position corresponding to a radial edge of a substrate to be supported. Each hole 410 is sized to fully receive the protrusion 116b such that the second side 114 of the arcuate sealing piece rests on the support plate. In embodiments comprising non-cylindrical protrusions and non-round holes, a similar relationship exists between the protrusion size and the hole size such that the hole is sufficiently large and sufficiently deep to accept the width and length of the protrusion.

The exemplary slot 412 is located proximate to the perimeter of the support plate 400 in a position corresponding to a radial edge of a substrate to be supported. The slot 412 is sized to fully accept a protrusion, for example 116a of arcuate sealing piece 100 such that the second side 114 of the arcuate sealing piece rests on the support plate. The slot 412 is spaced apart from the hole 410 along the circumference of the support plate 400 such that when protrusion 116b is placed in the hole 410, protrusion 116a may be positioned in a portion of slot 412. In combination, the hole 410 pins the arcuate sealing piece in place on the support plate, allowing for rotational movement only. During expansion and contraction of the arcuate sealing piece relative to the support plate, the protrusion 116a can travel within the slot 412, thus generally fixing the position of the arcuate sealing piece with respect to the support plate, while allowing for some movement between the two due to thermal expansion and contraction.

The exemplary hole and slot pair 410, 412 is typical for each of the second locating features on support plate 400, such that, when all of the arcuate sealing pieces 100 are appropriately located on the support plate 400 with protrusions 116b located in the appropriate holes 410 and protrusions 116a located in the appropriate slots 412, the arcuate sealing pieces form a ring similar to the ring 201 shown schematically in FIG. 2. Further, the first end portions 110 and second end portions 112 of arcuate sealing pieces 100 are positioned as illustrated in FIG. 2A.

As illustrated and described, the arcuate sealing piece 100 comprises the protrusions 116 and the support plate 400 comprises the hole 410 and slot 412. Embodiments in which the support plate 400 includes protrusions 116 and the arcuate sealing piece 100 comprises the hole 410 and the slot 412 are also contemplated.

Figure 5:
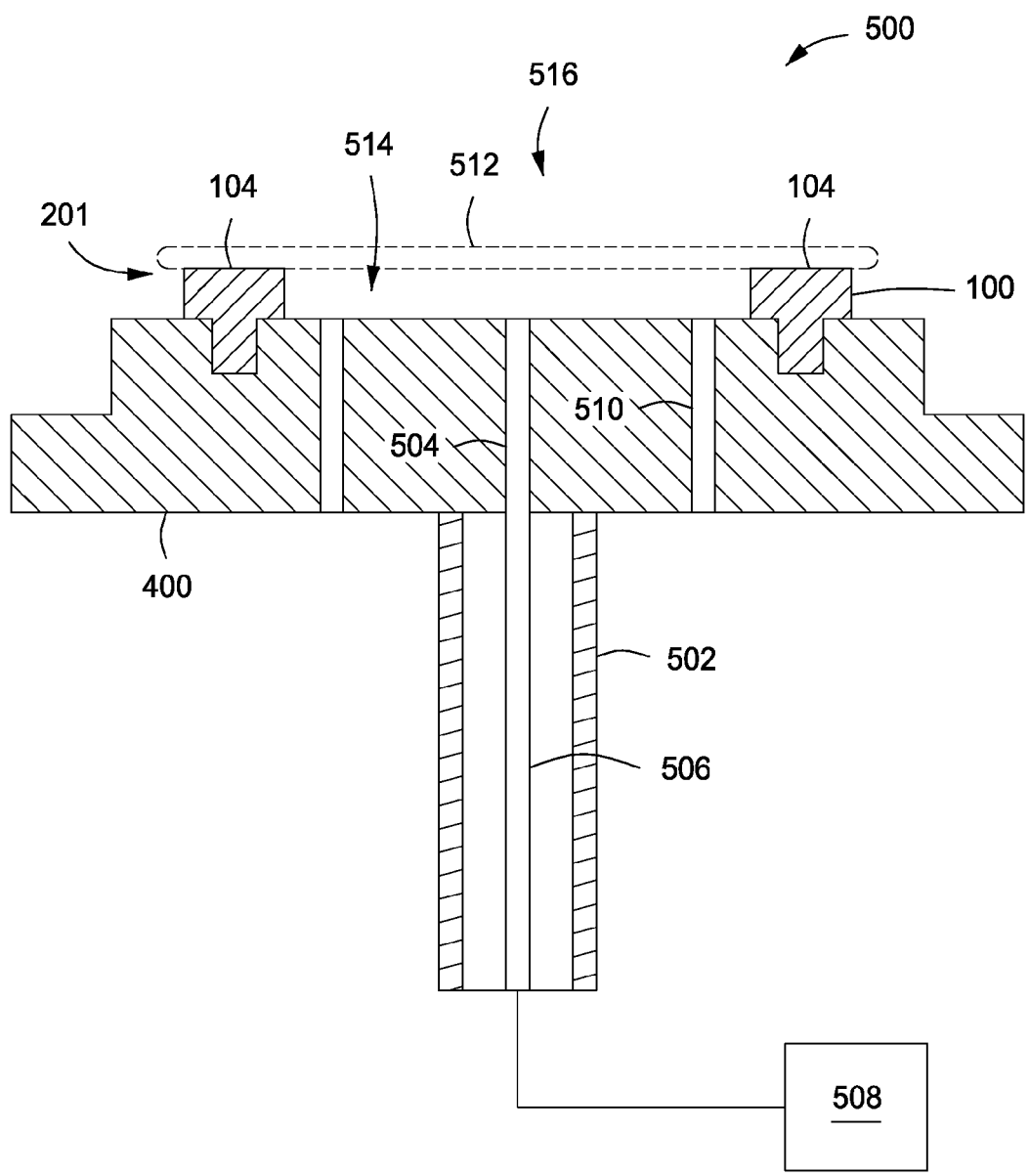
FIG. 5 depicts a schematic side view of a substrate support in accordance with some embodiments of the present invention.

FIG. 5 depicts a schematic side view of a substrate support 500 in accordance with some embodiments of the present invention. The substrate support 500 generally includes the support plate 400 disposed on a shaft 502 and having a plurality of arcuate sealing pieces 100 arranged on the support plate 400 to form a ring 201. The support surfaces 104 of the arcuate sealing pieces 100 together form a support surface for a substrate 512 (shown in phantom). The support surfaces 104 of the arcuate sealing pieces 100 also provide a sealing surface to substantially isolate a volume 514 defined between the ring 201, the support plate 400, and the substrate 512, when disposed on the ring 201, from a volume 516 disposed outside of the ring 201 and above or adjacent to the substrate 512. The support plate may include additional features, such as a conduit 504 for provision of a vacuum, heat transfer gases, or the like. The conduit may be coupled to a conduit 506 disposed in or though the shaft 502 to a support device 508 (such as a vacuum source or a heat transfer gas source). A plurality of lift pin holes 510 may also be provide to facilitate movement of lift pins (not shown) to raise and lower the substrate.

Thus, embodiments of a substrate support structure with a sealing surface formed from a plurality of arcuate sealing pieces have been provided herein. Benefits of the disclosed invention may include improved sealing of the substrate backside from contamination, improved sealing to facilitate vacuum fixturing as in a vacuum chuck, and reduced metal contamination of the substrate backside.

While the foregoing is directed to embodiments of the present invention, other and further embodiments of the invention may be devised without departing from the basic scope thereof.

The invention claimed is:

1. A substrate support structure, comprising:
an arcuate sealing piece comprising:
 a first top side including a generally planar support surface;
 a bottom side opposing the first top side;
 a first arcuate portion having a first thickness between the bottom side and the first top side;
 a second arcuate portion having a second thickness between the bottom side and a second top side and disposed radially inward of the first arcuate portion, the second thickness less than the first thickness;
 a first end portion comprising a first arcuate extension extending from the first arcuate portion, wherein the first arcuate extension extends beyond the second arcuate portion at the first end portion; and
 a second end portion comprising a second arcuate extension extending from the second arcuate portion, wherein the second arcuate extension extends beyond the first arcuate portion at the second end portion, and wherein the generally planar support surface includes the first arcuate extension, the first arcuate portion, and a portion of the second arcuate extension, the portion of the second arcuate extension having the first thickness between the bottom side and the first top side.

2. The substrate support structure of claim 1, wherein the first arcuate portion comprises the first arcuate extension.

3. The substrate support structure of claim 1, wherein the second arcuate portion comprises the second arcuate extension.

4. The substrate support structure of claim 1, wherein the first arcuate portion and the second arcuate portion comprise a unitary arcuate sealing piece.

5. The substrate support structure of claim 1, wherein the first arcuate portion and the second arcuate portion have a common center of curvature.

6. The substrate support structure of claim 1, wherein the bottom side has a first locating feature, the first locating feature comprising a first protrusion and a second protrusion.

7. The substrate support structure of claim 6, wherein at least one of the first protrusion and second protrusion is cylindrical.

8. The substrate support structure of claim 1, wherein the arcuate sealing piece comprises a non-metallic material.

9. The substrate support structure of claim 8, wherein the non-metallic material is aluminum nitride or aluminum oxide.

10. A substrate support, comprising:
a ring comprising a plurality of substrate support structures arranged to form the ring, wherein each of the plurality of substrate support structures comprises:
 an arcuate sealing piece comprising:
  a first top side including a generally planar support surface;
  a bottom side opposing the first top side;
  a first arcuate portion having a first thickness between the bottom side and the first top side;
  a second arcuate portion having a second thickness between the bottom side and a second top side and disposed radially inward of the first arcuate portion, the second thickness less than the first thickness;
  a first end portion comprising a first arcuate extension extending from the first arcuate portion, wherein the first arcuate extension extends beyond the second arcuate portion at the first end portion; and
  a second end portion comprising a second arcuate extension extending from the second arcuate portion, wherein the second arcuate extension extends beyond the first arcuate portion at the second end portion, and wherein the generally planar support surface includes the first arcuate extension, the first arcuate portion, and a portion of the second arcuate extension, the portion of the second arcuate extension having the first thickness between the bottom side and the first top side;
wherein the plurality of substrate support structures are arranged end-to-end such that respective first and second arcuate portions of the arcuate sealing pieces are circumferentially aligned and such that first and second arcuate extensions of adjacent arcuate sealing pieces are disposed in an adjacent and radially overlapping relationship.

11. The substrate support of claim 10, wherein at least one arcuate sealing piece further comprises a bottom side having a first locating feature, the first locating feature comprising a first protrusion and a second protrusion.

12. The substrate support of claim 11, wherein the substrate support structures further comprises:
   a support plate comprising a plate surface having a perimeter region and a second locating feature at the perimeter region, wherein the first and second locating features cooperate in positioning arcuate sealing pieces on the plate surface.

13. The substrate support of claim 12, wherein the first and second locating features cooperate in positioning arcuate sealing pieces to form the ring.

14. The substrate support of claim 12, wherein the first protrusion and the second protrusion are cylindrical, and wherein the second locating feature further comprises a first hole sized to accept the first protrusion and a second hole sized to accept the second protrusion.

15. The substrate support of claim 14, wherein the first hole is a cylindrical hole and the second hole is an elongated slot.

16. The substrate support structure of claim 1, wherein a transition to the portion of the second arcuate extension is stepped.

17. The substrate support of claim 10, wherein the plurality of substrate support structures are further arranged such that a circumferentially aligned first arcuate portion of a first arcuate sealing piece and a circumferentially aligned first arcuate portion of an adjacent second arcuate sealing piece form a first radial gap that extends from a second arcuate portion of the first arcuate sealing piece radially outward, a first arcuate extension of the first arcuate sealing piece and a second arcuate extension of the second arcuate sealing piece form an arcuate gap, and the circumferentially aligned second arcuate portion of the first arcuate sealing piece and the circumferentially aligned second arcuate portion of the adjacent second arcuate sealing piece form a second radial gap that extends from the first arcuate portion of the second arcuate sealing piece radially inward, the first radial gap, the arcuate gap, and the second radial gap forming a fluid passage.

\* \* \* \* \*